United States Patent [19]
Suh et al.

[11] Patent Number: 5,998,804
[45] Date of Patent: Dec. 7, 1999

[54] TRANSISTORS INCORPORATING SUBSTRATES COMPRISING LIQUID CRYSTAL POLYMERS

[75] Inventors: Suk Youn Suh, Warren; Sunny S. Shen, Holmdel, both of N.J.

[73] Assignee: HNA Holdings, Inc., Summit, N.J.

[21] Appl. No.: 08/888,022

[22] Filed: Jul. 3, 1997

[51] Int. Cl.⁶ .................................. H01L 35/24
[52] U.S. Cl. .................. 257/40; 257/57; 257/66; 257/347
[58] Field of Search .................. 257/40, 57, 66, 257/347

[56] References Cited

U.S. PATENT DOCUMENTS

| | | | |
|---|---|---|---|
| 4,161,470 | 7/1979 | Calundann | 260/40 P |
| 4,624,872 | 11/1986 | Stuetz | 428/1 |
| 4,838,656 | 6/1989 | Stoddard | 350/336 |
| 5,028,916 | 7/1991 | Ichikawa et al. | 340/784 |
| 5,079,595 | 1/1992 | Suzuki et al. . | |
| 5,121,190 | 6/1992 | Hsiao et al. . | |
| 5,238,865 | 8/1993 | Eguchi . | |
| 5,292,688 | 3/1994 | Hsiao et al. . | |
| 5,401,911 | 3/1995 | Anderson et al. | 174/262 |
| 5,409,857 | 4/1995 | Watanabe et al. . | |
| 5,542,601 | 8/1996 | Fallon et al. . | |
| 5,545,429 | 8/1996 | Booth et al. | 427/97 |
| 5,546,889 | 8/1996 | Wakita et al. | 117/84 |
| 5,672,296 | 9/1997 | Shen et al. | 252/299.01 |

OTHER PUBLICATIONS

Akimichi et al., Field–effect Transistors Using Alkyl Substituted Oligothiophenes, *Appl. Phys. Lett.*, Apr. 8, 1991, vol. 58, No. 14, pp. 1500–1502.

*Physical Science And Technology*, vol. 8, pp. 176–179, 1987.

*Physical Science And Technology*, vol. 5, pp. 710–712, 1987.

Garnier, et al. All–Polymer Field–Effect Transistor Realized By Printing Techniques, Science, Sep. 16, 1994, vol. 265, pp. 1684–1686.

Dodabalapur, et al. Organic Transistors: Two Dimensional Transport and Improved Electrical Characteristics, Science, Apr. 14, 1995, vol. 268, pp. 270–271. (with reference attached).

*Encyclopedia Of Materials Science and Engineering*, Vo. 6, pp. 4350–4357, 1986.

*Primary Examiner*—Sara Crane
*Attorney, Agent, or Firm*—Alston & Bird LLP

[57] ABSTRACT

Disclosed in this invention are transistors which contain substrates that are made of liquid crystalline polymers. Such substrates are compatible with semiconducting layers especially organic semiconducting layers. This enables one to prepare all organic transistors.

15 Claims, 1 Drawing Sheet

TRANSISTORS INCORPORATING SUBSTRATES COMPRISING LIQUID CRYSTAL POLYMERS

FIELD OF THE INVENTION

This invention relates generally to transistors. Specifically it discloses transistors that incorporate substrates which comprise liquid crystal polymers. This advantageously allows the use of a wide range of plastic substrate materials thereby conferring several advantages on the design and utility of the devices.

BACKGROUND OF THE INVENTION

Transistors are widely used components in devices and articles such as, for example, liquid crystal display devices ("LCDs"), Notebook Personal Computers (PCs), calculators, watches, liquid crystal color TVs, toys, word processors, and the like. There are several kinds of transistors such as, for example, Field Effect Transistors ("FETs"), Thin Film Transistors ("TFTs"), and the like. However, they all generally have three main elements in them: However, they all generally have three main elements in them: a substrate, a semiconductor (or semiconducting) layer and electrodes attached to the semiconducting layer.

In a common construction of a TFT/FET, the substrate, which is typically a single crystalline silicon wafer is coated with an insulating layer, typically silicon dioxide grown directly on the silicon. Generally two electrodes (the source and drain electrodes) are attached to the insulating layer. The silicon crystal acts as the gate electrode by being appropriately attached via a conducting paste to the silicon. The semiconductor layer is deposited on the insulator. Generally the semiconducting material is inorganic.

While transistors built on silicon and similar substrates have enjoyed much commercial success, there has been a perceptible move toward other substrates recently. Typically the silicon-based transistors are rigid and not flexible since they are built on rigid substrates. Therefore, where a flexible device is desired, the silicon based transistors have less utility. There are problems associated with breaking, delamination and the like. A typical example is a smart card. Smart cards are currently manufactured with silicon-based semiconductors and require substantial protection from abuse, bent, damaging of functionalities on the card and the like, thus adding significant cost to manufacture them. A flexible substrate like an organic substrate will be of substantial benefit to such devices. This is true of many toys, miniature or space saving electronic gadgets and the like.

Furthermore, orientation of the substrate is important when using thin film semiconducting materials. This is particularly true when using organic semiconducting materials (see below). The orientation of the semiconductor lo layer depends on the orientation of the substrate. In order for the semiconductor to become oriented, the substrate has to be a nearly defect free single crystal since even slight defects affect the orientation of the semiconductor layer. Otherwise expensive and generally low yielding thermal annealing process has to be used.

Attempts have been made to use organic semiconductor materials on silicon. H. Akimichi et al, *Applied Physics Letters*, Vol. 58 (14), 1500 (1991) describe FETs containing alkyl substituted oligothiophenes as the semiconducting material. A. Dodabalapur et al, *Science*, Vol. 268, 270 (1995) describe organic transistors containing the oligomer, α-hexathienylene ("α-6T"), as the semiconductor. F. Garnier et al, *Science*, Vol. 265, 1684 (1994) describe FETs containing α,ω-di(hexyl)sexithiophene as the semiconductor material.

However, there are other problems that occur when one uses an organic semiconductor on an inorganic substrate. The bonding between the two layers is less than desirable limiting the utility of the device. Without strong chemical interaction between the substrate and the semiconducting material, it is very difficult to deposit crystalline thin films. Organic substrates are therefore preferred for organic semiconducting materials. In the case of inorganic semiconducting materials, such as silicon-based semiconductors, generally annealing procedures are used, especially for manufacturing liquid crystal display devices ("LCDs") (such as, for example, the active matrix devices and super twisted nematic devices) because of relatively high lattice energies of such substrate materials. However, the annealing processes require over 1000° C. temperatures. The use of suitable organic substrates may permit the omission of such annealing step. Furthermore, In general, due to the low lattice energies associated with many organic semiconducting materials, annealing processes do not work properly, thus resulting in low manufacturing yields. It will, therefore, be useful if suitable organic substrates are available that are sufficiently transparent, can be oriented and processed at low temperatures and thus be useful for transistor fabrication.

It is, therefore, an object of this invention to provide transistors containing organic polymeric substrates that are transparent and can be oriented.

It is an additional object of this invention to provide devices containing transistors which contain organic polymeric substrates.

It is a further object of this invention to provide transistors containing organic polymeric substrates and organic semiconductors.

It is yet another object of this invention to provide oriented organic polymeric substrates with substantially reduced defects for transistor applications.

Other objects and advantages of the present invention shall become apparent from the accompanying summary, drawings and description.

BRIEF DESCRIPTION OF THE DRAWINGS

The present invention is described in view of the following description and the accompanying FIG. 1.

SUMMARY OF THE INVENTION

Figure 1:
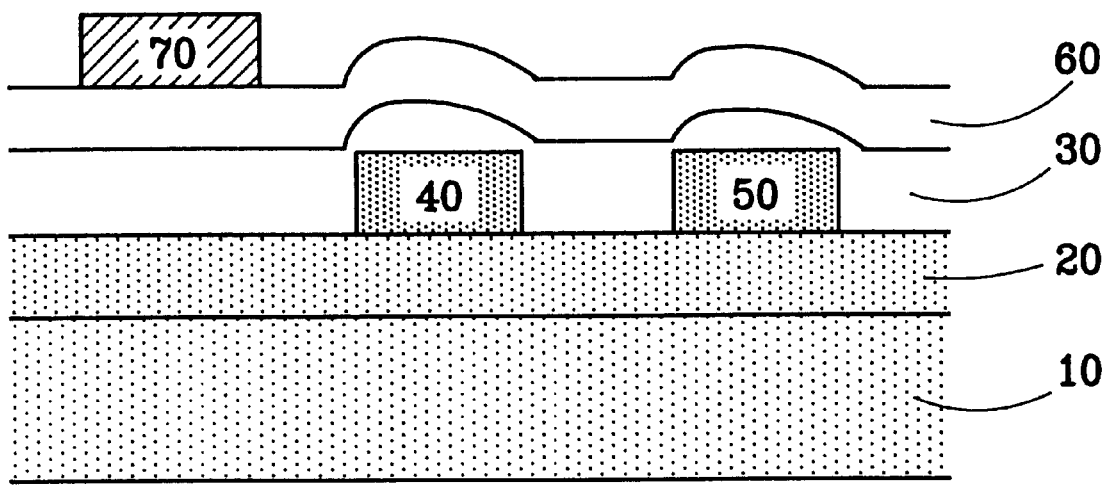
FIG. 1 illustrates a sectional view of a transistor, an FET, built according to this invention as described later.

One or more of the foregoing objects are accomplished by the present invention which provides transistors fabricated on substrates which comprise liquid crystal polymers ("LCPs"). The semiconductor layer is present directly on the LCP-based substrate. The LCP-based substrates are compatible with organic semiconductors, and possibly also with inorganic semiconductors, although transistors that contain organic semiconductors are preferred in the invention. LCPs are well known and they are suitable in the practice of this invention. An example of an useful LCP is the VECTRA A® brand LCP available from Hoechst Celanese Corporation, Somerville, N.J. The VECTRA A® resin comprises monomeric moieties from 4-hydroxybenzoic acid and 6-hydroxynaphthoic acid in a 73:27 molar ratio. Other useful LCPs include those that are disclosed in pending patent application, Ser. No. 08/460,288, filed Jun. 2, 1995, and comprise repeat units corresponding to the formula:

wherein $P^1$ is an aromatic hydroxy monocarboxylic acid or an aromatic amino carboxylic acid; $P^2$ is an aromatic dicarboxylic acid; P³ is a phenolic compound; m, n and q represent mole percent of the respective monomers, with m, n, and q may generally ranging from 5–70% individually. In addition to P¹, P² and P³, additional monomeric moieties may be part of the polymer repeat unit. Such an LCP may be cast into a film with sufficient transparency and orientation suitable as a substrate for building transistors therewith. Being a polymeric substrate it is suitable for rigid as well as flexible devices. Using an LCP furthermore paves way to bring down processing temperatures when using organic semiconducting material, thus advantageously offering a way to make organic material based active matrix devices. Since the LCPs are easily oriented, and the bonding between the LCP-based substrate and the semiconductor layer thereon is good, the semiconductor layer easily maintains its orientation.

DESCRIPTION OF THE INVENTION

In its embodiments, the present invention teaches a transistor fabricated on a substrate comprising a liquid crystalline polymer ("LCP") as well as a process to make such a transistor. In an illustrative FET shown in FIG. 1, an LCP-polymer film is the substrate (10). An organic semiconducting layer 20 is on top of, and in intimate contact with, the substrate, and an insulating dielectric layer 30 is present on top of, and in intimate contact with, the semiconducting layer. There is a metallic conducting layer 60 on the insulating layer. The device is completed with the formation of the source and drain electrodes (40 and 50 respectively) and the gate 70. Other optional layers may also be included in the construction of the FET as desired for the particular device. While the above illustration is for constructing an FET, other types of transistors may also be fabricated using the LCP-based substrate as will be obvious to those skilled in the art.

The substrate comprises an LCP. LCPs are known in the art, and many are liquid crystalline polyester, polyamide, polyesteramide, polyketone, polycarbonate, polyurethane, polyether and the like. They are well suited in the practice of the invention. Preferred LCPs are polyester or polyesteramide. for example, the VECTRA A® brand LCP available from Hoechst Celanese Corporation and described above. Many other useful LCPs are disclosed in the above-noted pending application, Ser. No. 08/460,288. An illustrative LCP disclosed therein comprises repeat units corresponding to the formula:

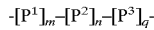

wherein P¹ is an aromatic hydroxy monocarboxylic acid or an aromatic amino carboxylic acid; P² is an aromatic dicarboxylic acid; P³ is a phenolic a compound; m, n and q represent mole percent of the respective monomers ranging generally from 5–70% individually. The preferred range of m is about 5–40%, n is about 5–40% and q is about 5–30%. In addition to P¹, P² and P³, additional monomeric moieties such as, for example, a second aromatic amino carboxylic acid moiety or an aromatic hydroxy carboxylic acid moiety-[P⁴]$_r$-, a diphenol moiety -[P⁵]$_s$ may be part of the polymer repeat unit, in which case r is about 5–20 mole %, and s is about 5–20 mole %. P⁴ is different from P¹ and P⁵ is different from P³. Still additional monomers may also be present such as, for example, phenyl hydroquinone, methyl hydroquinone and the like. Such LCPs typically possess high glass transition temperatures (Tg) and melt temperatures.

In the above general formula, the monomer P¹ is selected from the group consisting of 4-hydroxybenzoic acid, 2-hydroxy6-naphthoic acid, and 4-carboxy-4'-hydroxy-1,1'-biphenyl. 4-Hydroxybenzoic acid is preferred. When P¹ is an amino carboxylic acid, it may be, for example, 4-amino benzoic acid. P² may be terephthalic acid, isophthalic acid, phthalic acid, 2-phenylterephthalic acid, 1,2-naphthalenedicarboxylic acid, 1,4-naphthalenedicarboxylic acid, 2,6-naphthalene dicarboxylic acid and 4,4'-biphenyldicarboxylic acid; terephthalic acid is preferred. P³ is selected from the group consisting of resorcinol, hydroquinone, methyl hydroquinone, phenyl hydroquinone, catechol, 4,4'-dihydroxybiphenyl and acetaminophen; 4,4'-dihydroxybiphenyl is preferred. P⁵ is a diphenol selected from resorcinol, hydroquinone, catechol, 4,4'-dihydroxybiphenyl, bisphenol-A and acetaminophen. A preferred liquid crystal polyester is a wholly aromatic thermotropic liquid crystal polyester which comprises 4-hydroxybenzoic acid, 6-hydroxy-2-naphthoic acid, terephthalic acid, 4,4'-dihydroxybiphenyl and resorcinol in a molar ratio 30:30:20:10:10 respectively (referred to as COT-BPR hereafter).

The LCP may be converted into a film suitable for transistor substrate by any known process. Some such processes are melt extrusion, solution casting, spin coating and the like. The substrates have thickness generally in the range 5 μm–5 mm, preferably 10 μm–1 mm and typically 25 μm–100 μm. The thus-formed film possesses high transparency (at least 70% transmission in the visible) and a high degree of orientation. For example, one can achieve an orientation function (or order parameter) greater than 0.9 with such liquid crystal polymer films. The order parameter is defined as:

$$<P_2(\cos\theta)>=(3<\cos^2\theta>-1)/2$$

where
   θ is the angle between dye and film draw axes
   <> is the average orientation
   $<P_2(\cos\theta)>$ is the averaged order parameter as a function of cos θ.

The substrate is coated with a semiconducting layer. The semiconducting layer may be organic or inorganic; an organic layer is preferred. Illustrative inorganic semiconductors are doped silicon, doped gallium-arsenide, indium phosphide and the like. They may be deposited by, for example, sputter coating, vacuum coating, and the like. Illustrative organic semiconductor may be a small molecule, oligomer or polymer. Some illustrative organic semiconductors useful in the practice of this invention are an oligothiophene such as -6T, di(hexyl)sexithiophene, alkylthiophene such as α,α'-diethylquarterthiophene, polyacetylene, polydiacetylene, complexed tetrathiafulvalene, polyaniline, polypyrrole and the like. The organic semiconductor may be deposited suitably by methods such as, for example, spin coating, web coating, vacuum coating, and the like. The thickness of the coating generally ranges between 5–40 nm depending on the targeted characteristic of the desired device. Generally, thicker films provide higher field induced conductance in the range of $10^{-6}$~$10^{-8}$ S.cm$^{-1}$.

The insulating layer goes on top of the semiconductor layer. The insulating layer may also be organic or inorganic; organic is preferred. Some illustrative layers which may be cast into insulating layer are polyimide (for example, the KAPTON® brand polyimide available from E. I. duPont de Nemours Company, Wilmington, Del.), polymethyl methacrylate (PMMA), polycarbonate, polyethylene terephthalate (PET) and the like. The layer may be deposited by a suitable process such as spin coating, brush coating and the like. Illustrative inorganic insulating layers are $SiO_2$, silicon nitride and the like which may, for example, be vacuum coated or sputter coated. The thickness of the insulating layer is generally in the range 1 nm–1 $\mu$m, preferably in the range 5 nm–100 nm and typically in the range 10 nm–50 nm.

In a transistor, in addition to the above mentioned layers, there are also source electrode, drain electrode and gate. Materials useful for such applications are, for example, conducting metals such as gold, silver and the like, graphite, conducting silver paste and the like. Organic conductors such as, for example, iodine-doped polyacetylene may also be used. Such materials and processes to use them are well known to those skilled in the art.

A suitable process to prepare such the inventive transistor, a TFT in this case, is illustrated as follows: About a 100 $\mu$m thick film of a suitable LCP is prepared by means of the extrusion process described in the Example 1. A thin film of hexathienylene ($\alpha$-6T) organic semiconductor, approximately 40 nm thick, is deposited on the LCP film by using conventional thermal evaporation techniques. About a 30 nm thick gold film is deposited on top of the semiconductor layer by well known sputtering techniques. Source and drain electrode pads are defined photolithiographically on the gold layer. Photolithography is a well known art. The gold layer, outside of the pads defined by photolithography, is removed by etching by known wet chemical techniques. The spacing between the pads, which corresponds to the gate length of the TFT, is about 5 $\mu$m, and the width of the pads is 250 $\mu$m. About a 5 nm thick layer of silicone dioxide is deposited on top of the substrate surface. Finally about a 30 nm gold layer is deposited by sputtering. This gold layer is acting as the gate electrode.

The invention is further illustrated by the Examples below. The scope of the invention, however, should not be construed limited in any way by the Examples.

EXAMPLES

Example 1. Preparation of COTBPR

This example illustrates the preparation of COTBPR polyester from a 1 mole reaction mixture of 4-hydroxy benzoic acid (HBA), 6-hydroxy-2-naphthoic acid (HNA), terephthalic acid (TA), 4,4'-biphenol (BP), and resorcinol (R) in the ratio 30:30:20:10:10.

To a 500 ml 3-neck flask equipped with a half-moon shaped TEFLON® stirrer blade, gas inlet tube, thermocouple, a Vigreux column attached to a condenser and receiver were added the following:

a) 41.440 grams of 4-hydroxy benzoic acid (0.3 moles);
 b) 56.456 grams of 6-hydroxy-2-naphthoic acid (0.3 moles);
 c) 33.226 grams of terephthalic acid (0.2 moles);
 d) 8.600 grams of 4,4-biphenol (0.1 moles);
 e) 1.012 grams of resorcinol (0.1 moles);

The flask was immersed in an oil bath and provided with means to accurately control the temperature. The flask was thoroughly purged of oxygen by evacuation and then flushed with nitrogen three times, and slowly heated in the oil bath; and f) 0.02 grams of potassium acetate was added as a catalyst along with 105.48 grams of acetic anhydride (2.5% excess). Acetic acid began to distill over and was collected in a graduated cylinder.

The contents of the flask were heated while stirring at a rate of 2000 rpm to 200° C. over a period of 60 minutes at which time 10 ml of acetic acid had been collected. The reaction temperature was then gradually raised at a rate of about 1° C./min to 320° C. at which time 96 ml of acetic acid had been collected. The flask was heated at 320° C. for another 60 min. A total of 110.5 ml of acetic acid had been collected. The flask was then evacuated to a pressure of 1.0 mbar at 320° C. while stirring. During this period the polymer melt continued to increase in viscosity while the remaining acetic acid was removed from the flask. The flask and its contents were removed from the oil bath and were allowed to cool to the ambient temperature. Polymer was then removed from the flask and a total of 120 grams of polymer was obtained.

The resulting polyester had an inherent viscosity (IV) of 2.0–2.4 dl/g as determined in a pentafluorophenol solution of 0.1 percent by weight concentration at 60° C. and a melt viscosity (MV) of 550 poise at a shear rate of $10^3$ $sec^{-1}$ measured at 230° C. in a capillary rheometer using an orifice of 1 mm diameter and 30 mm length.

When the polymer was subjected to differential scanning calorimetry (10° C./min heating rate), it exhibited a glass transition temperature (Tg) of 106° C. When the polymer was examined by hot-stage cross-polarized optical microscopy, it has a transition temperature from solid to liquid crystalline ($T_{s \rightarrow lc}$) at 170° C. The polymer melt was optically anisotropic.

EXAMPLES 2–14

Following the procedure outlined in Example 1, the following additional variants of the COTBPR composition were prepared having different proportions of the five ingredients noted above for COTBPR. Composition, glass transition temperature, melt temperature ($T_m$, defined as the peak of a melt endotherm shown in differential scanning calorimetry ) and I.V. for the compositions appear in Table I below. Unless otherwise indicated, properties were measured as in Example 1.

EXAMPLES 15–24

Table II lists liquid crystalline polymers (Examples 15–24) which are not variants of COTBPR since they include additional monomers ("X" in Table II) or exclude some monomers of COTBPR ("—" in Table II). They are also useful in the practice of the invention. Especially useful is the LCP of Example 24 with brand name VECTRA A®.

EXTRUSION OF FILM AND MEASUREMENT OF PROPERTIES 20 grams of the polyester from any of the above examples were compacted into a rod of ⅜ inch diameter. The rod was charged into the melting section of a micro fiber spinning unit. The polymer was melted and fed at a rate of 0.56 g/minute into a melt chamber. A slit die was located at the end of the melt chamber through which the polymer melt was extruded. The dimensions of the slit were ¼ inch by 5 thousandths of an inch. The extruding film was taken up by a take-up roll. During the spinning, the heater temperature was maintained at 230–330° C., the melt chamber temperature at 230–350° C. and the die temperature 235–330° C. (The actual temperature in the range depends on the composition of the polymer.) The take-up speed of the film was 5 m/minute. The melt drawdown ratio, defined as the ratio of the take-up speed to the exit speed of the extruding film at the die exit, was 9. The width of the tape was 0.2 inches and the thickness 0.5 thousandths of an inch.

ORIENTATION OF THE LIQUID CRYSTAL POLYMER INTO A SUBSTANTIALLY DEFECT-FREE FILM

Films, 7–12 $\mu$m thick, were spun from both COTBPR polymer and VECTRA A® polymer (Example 24 in Table II). Orientation was measured by micro-focused x-ray diffraction on both films. The x-ray beam size was about 5 μm, and it scanned a film area about 100×100 μm. The results indicated that the molecular chains, averaged over 5 μm in size, are highly aligned with respect to each other with an average deviation of only 0.2 degree. The orientation function in VECTRA A® film was observed to be very high with only very small standard deviation (0.9827+/−0.0006). The COTBPR film also showed only a very small distribution (0.9553+/−0.0027). Transmission in the visible light was more than 70%.

LCP film orientation parameters were also measured with a x-ray beam sized at 500 μm. Table III lists the high orientation parameters averaged over a 500 μm scale that were achieved for many of the LCP compositions as measured by the x-ray beam method. As Table III shows, the average orientation is also very high with the polymers indicating that the orientation is substantially defect-free.

COATING OF ORGANIC SEMICONDUCTING MATERIALS

An organic semiconducting material such as thiophene oligomer α-6T is spin coated on the COTBPR film described above using conventional coating technology such as spin coating, web coating, vacuum coating, etc. The thickness of the coating is varied between 5–40 nm depending on the targeted characteristics of the desired device. Generally, thicker films provide higher field induced conductance in the range of $10^{-6} \sim 10^{-8}$ S.cm$^{-1}$. Depending on the choice of materials and deposition and deposition technique used, the field effect mobility can exceed 0.02 cm$^2$/Vs, which is sufficient to fabricate a practical FET's.

TABLE 1

| Example | HBA:HNA:TA:BP:R | Tg °C. | Tm °C. | $T_{s61c}$ °C. | I.V. (dl/g) |
|---|---|---|---|---|---|
| 1 | 30:30:20:10:10 | 106 | none | 170 | 2.5 |
| 2 | 20/30/25/15/10 | 108 | none | 280 | 2.74 |
| 3 | 30/20/25/15/10 | 107 | none | 275 | 2.12 |
| 4 | 40/10/25/15/10 | 106 | none | 255 | 1.96 |
| 5 | 30/10/30/20/10 | 111 | none | 280, 385 | 2.64 |
| 6 | 20/20/30/20/10 | 108 | none | 350, 385 | 2.74 |
| 7 | 10/30/30/20/10 | 113 | none | 290, 400 | 2.48 |
| 8 | 20/30/25/10/15 | 113 | none | 160 | 2.10 |
| 9 | 20/30/25/5/20 | 122 | none | 163 | 1.76 |
| 10 | 35/35/15/10/5 | 107 | 179 | 135 | 4.14 |
| 11 | 30/40/15/10/5 | 107 | 190 | 145 | 3.30 |
| 12 | 20/40/20/15/5 | 109 | 226 | 125 | 3.34 |
| 13 | 30/30/20/15/5 | 109 | 233 | 155 | 2.68 |
| 14 | 20/30/25/20/5 | 112 | 301 | 250 | 3.93 |

TABLE II

| Example | HBA:HNA:TA:BP:R:X | X |
|---|---|---|
| 15 | 25/35/20/—/—/20 | Phenyl hydroquinone |
| 16 | 30/30/20/—/—/20 | Phenyl hydroquinone |
| 17 | 30/30/20/20/—/10 | Phenyl hydroquinone |
| 18 | 30/30/20/—/10/10 | Phenyl hydroquinone |
| 19 | 30/30/20/7/7/6 | Phenyl hydroquinone |
| 20 | 25/35/20/—/—/20 | Methyl hydroquinone |
| 21 | 30/30/20/10/—/10 | Methyl hydroquinone |
| 22 | 30/30/20/—/10/10 | Methyl hydroquinone |
| 23 | 30/30/20/5/10/5 | Acetaminophen |
| 24 (VECTRA A ®) | 73/27/—/—/—/— | — |

TABLE III

| Polymer of EXAMPLE | Orientation Parameter |
|---|---|
| 1 | 0.91 |
| 9 | 0.79 |
| 15 | 0.89 |
| 16 | 0.89 |
| 17 | 0.92 |
| 18 | 0.84 |
| 19 | 0.89 |
| 21 | 0.95 |
| 22 | 0.88 |
| 24 | 0.97 |

What is claimed is:

1. A transistor comprising an organic substrate and a semiconducting material, wherein said substrate comprises a wholly aromatic thermotropic liquid crystalline polymer, said liquid crystal polymer comprising a polyester, said polyester comprising repeat units from 4-hydroxybenzoic acid and 6-hydroxynapthoic acid.

2. The transistor of claim 1, wherein said polyester comprises repeat units corresponding to the formula:

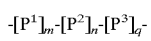

$-[P^1]_m-[P^2]_n-[P^3]_q-$ wherein $P^1$, $P^2$ and $P^3$ represent monomeric moieties with $P^1$ being an aromatic hydroxy carboxylic acid, $P^2$ being an aromatic dicarboxylic acid and $P^3$ being a phenol; and m, n and q represent mole percent of the respective monomers ranging from 5–70 mole percent individually.

3. The transistor of claim 2, wherein said repeat unit further comprises monomeric moieties $-[P^4]_r-$ and $-[P^5]_s-$, wherein $P^4$ represents a second aromatic hydroxycarboxylic acid moiety different from $P^1$, and $P^5$ represents a second phenolic moiety different from $P^3$, and r and s represent mole percent of the respective monomers ranging from 5–20 mole percent individually.

4. The transistor of claim 2, wherein $P^1$ is selected from the group consisting of 4-hydroxybenzoic acid, 2-hydroxy-6-naphthoic acid, and 4-carboxy-4'-hydroxy-1,1'-biphenyl.

5. The transistor of claim 2, wherein $P^2$ is selected from the group consisting of terephthalic acid, isophthalic acid, phthalic acid, 2-phenylterephthalic acid, 1,2-naphthalenedicarboxylic acid, 1,4-naphthalenedicarboxylic acid, 2,6-naphthalene dicarboxylic acid and 4,4'-biphenyldicarboxylic acid.

6. The transistor of claim 2, wherein $P^3$ is selected from the group consisting of resorcinol, hydroquinone, methyl hydroquinone, phenyl hydroquinone, catechol, 4,4'-dihydroxybiphenyl and acetaminophen.

7. The transistor of claim 3, wherein said $P^5$ is a diphenol selected from the group consisting of resorcinol, hydroquinone, catechol, 4,4'-dihydroxybiphenyl, bisphenol-A and acetaminophen.

8. The transistor of claim 4, wherein $P^1$ is 4-hydroxybenzoic acid.

9. The transistor of claim 5, wherein $P^2$ is terephthalic acid.

10. The transistor of claim 6, wherein $P^3$ is 4,4'-dihydroxybiphenyl.

11. The transistor of claim 3, wherein said $P^4$ is 4-hydroxybenzoic acid.

12. The transistor of claim 3, wherein said $P^5$ is resorcinol.

13. The transistor of claim 1, wherein the semiconducting material is organic.

14. The transistor of claim 1, wherein the semiconducting material is inorganic.

15. The transistor of claim 1, wherein said liquid crystal polyester comprises 4-hydroxybenzoic acid, 6-hydroxy-2-naphthoic acid, terephthalic acid, 4,4'-dihydroxybiphenyl and resorcinol in a molar ratio 30:30:20:10:10 respectively.

* * * * *